(12) United States Patent
Oh

(10) Patent No.: US 10,629,774 B2
(45) Date of Patent: Apr. 21, 2020

(54) SEMICONDUCTOR DEVICE WITH ELECTRIC FIELD DISTRIBUTION PART

(71) Applicant: LG INNOTEK CO., LTD., Seoul (KR)

(72) Inventor: Jung Hun Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/309,883

(22) PCT Filed: Jun. 14, 2017

(86) PCT No.: PCT/KR2017/006205
§ 371 (c)(1),
(2) Date: Dec. 13, 2018

(87) PCT Pub. No.: WO2017/217764
PCT Pub. Date: Dec. 21, 2017

(65) Prior Publication Data
US 2019/0273180 A1 Sep. 5, 2019

(30) Foreign Application Priority Data

Jun. 14, 2016 (KR) .................. 10-2016-0074006

(51) Int. Cl.
*H01L 33/14* (2010.01)
*H01L 33/38* (2010.01)
(Continued)

(52) U.S. Cl.
CPC .............. *H01L 33/14* (2013.01); *H01L 33/02* (2013.01); *H01L 33/36* (2013.01); *H01L 33/38* (2013.01); *H01L 33/387* (2013.01); *H01L 33/40* (2013.01)

(58) Field of Classification Search
CPC ....... H01L 33/14; H01L 33/40; H01L 33/387; H01L 33/38; H01L 33/02; H01L 33/36
(Continued)

(56) References Cited

U.S. PATENT DOCUMENTS 8,785,962 B2 * 7/2014 Lee .................. H01L 33/387
257/99
9,312,437 B2 * 4/2016 Epler .................. H01L 33/145
(Continued)

FOREIGN PATENT DOCUMENTS

JP 2001-274516 A * 10/2001 ............. H01S 5/227
KR 10-2011-0112999 A 10/2011
(Continued)

*Primary Examiner* — Alexander O Williams
(74) *Attorney, Agent, or Firm* — Birch, Stewart, Kolasch & Birch, LLP

(57) ABSTRACT

A semiconductor device includes a substrate; first and second semiconductor layers arranged on the substrate and having different conductive types; a third semiconductor layer arranged between the first semiconductor layer and the second semiconductor layer; a first electrode arranged on the first semiconductor layer so as to be electrically connected to the first semiconductor layer; a second electrode arranged on the second semiconductor layer so as to be electrically connected to the second semiconductor layer; and a first insulating layer arranged, between the first electrode and the second electrode, on the exposed first, second and third semiconductor layers, wherein a first end part, close to the second electrode, among both end parts of the first electrode, and/or a second end part, which is both end parts of the second electrode, has an electric field dispersion part.

19 Claims, 14 Drawing Sheets

(51) Int. Cl.
*H01L 33/40* (2010.01)
*H01L 33/02* (2010.01)
*H01L 33/36* (2010.01)

(58) Field of Classification Search
USPC .......................................................... 257/13
See application file for complete search history.

(56) References Cited

U.S. PATENT DOCUMENTS

| 9,583,679 | B2* | 2/2017 | Epler | .................... H01L 33/145 |
| 2012/0299048 | A1* | 11/2012 | Lee | ......................... H01L 33/14 |
| | | | | 257/99 |
| 2014/0217448 | A1* | 8/2014 | Kim | ...................... H01L 33/405 |
| | | | | 257/98 |
| 2014/0264430 | A1* | 9/2014 | Epler | .................... H01L 33/145 |
| | | | | 257/103 |
| 2016/0197270 | A1* | 7/2016 | Beach | ..................... H01L 43/12 |
| | | | | 438/3 |

FOREIGN PATENT DOCUMENTS

| KR | 10-2012-0131983 A | 12/2012 |
| KR | 10-2013-0006810 A | 1/2013 |
| KR | 10-2014-0100115 A | 8/2014 |
| WO | WO 2013/068878 A1 | 5/2013 |

\* cited by examiner

[FIG. 1]
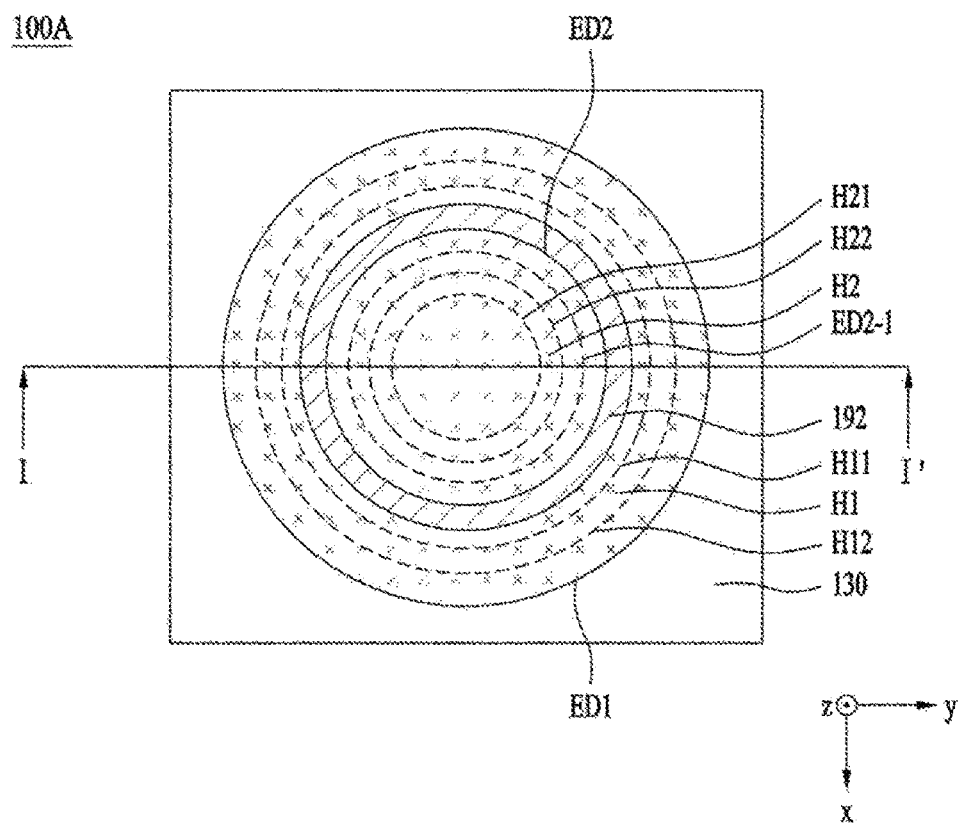

[FIG. 2]
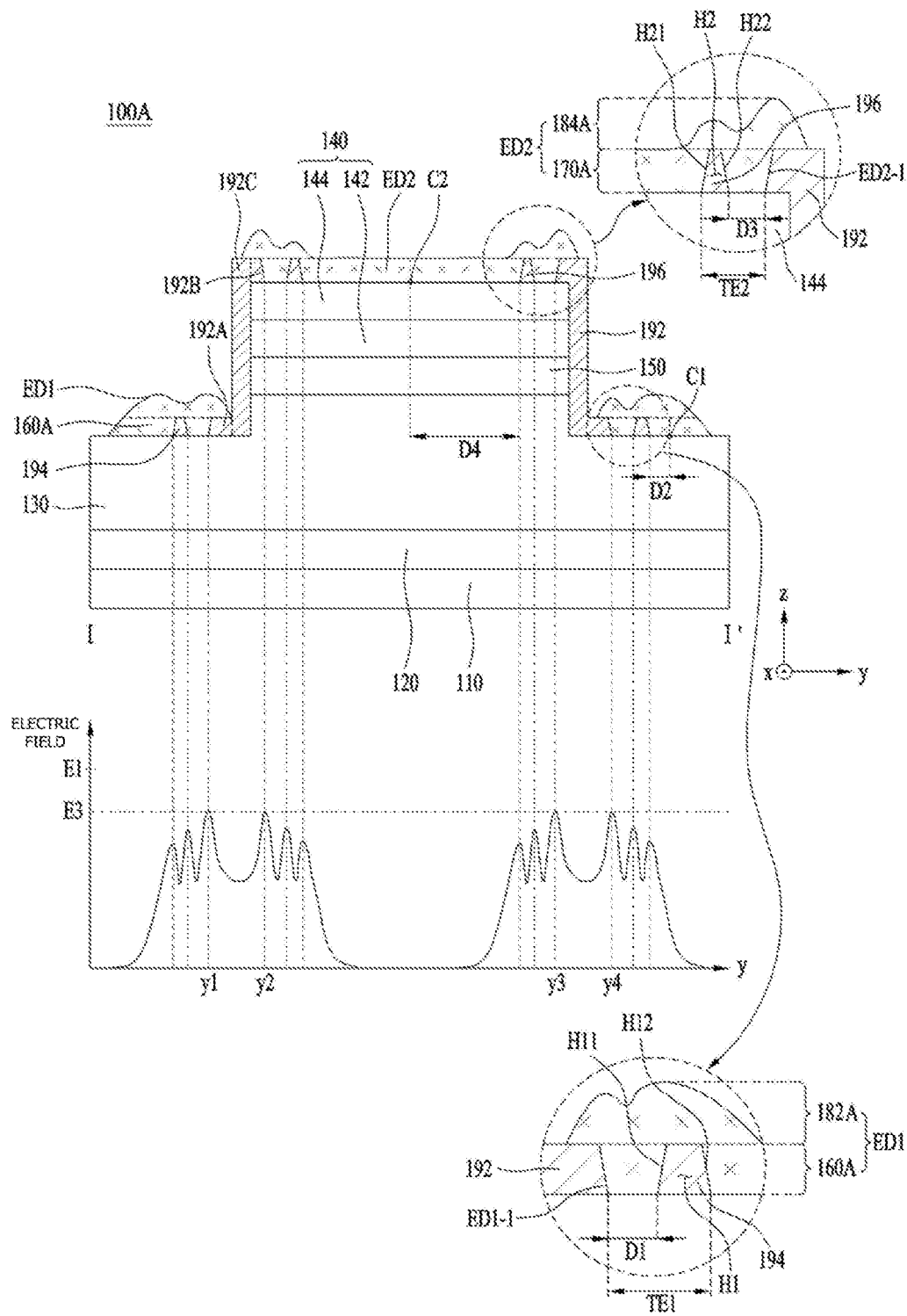

[FIG. 3]
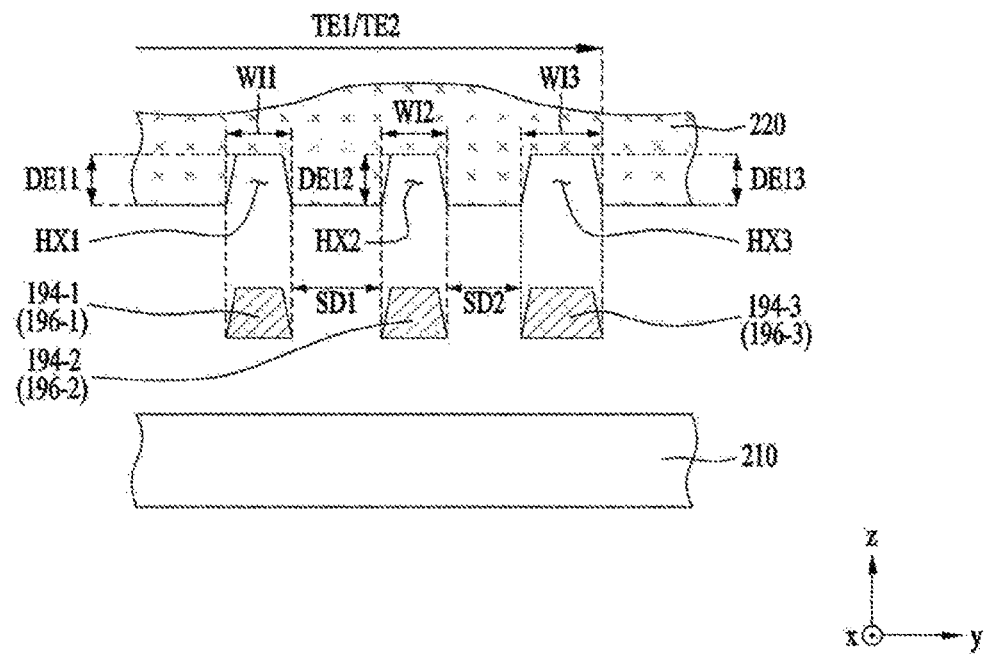

[FIG. 4]
100B
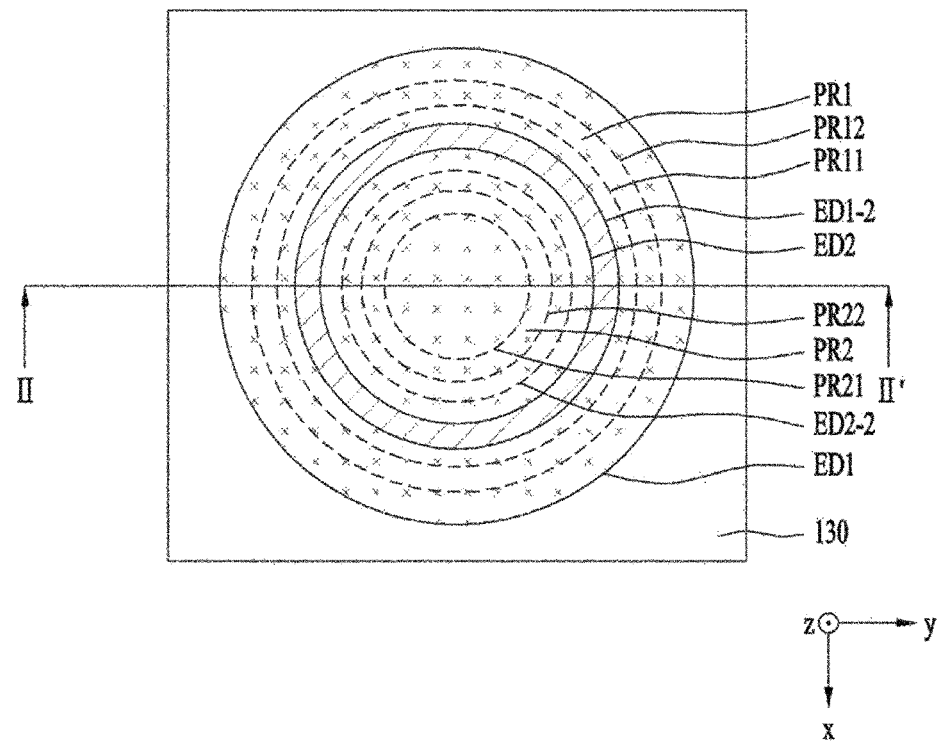

[FIG. 5]
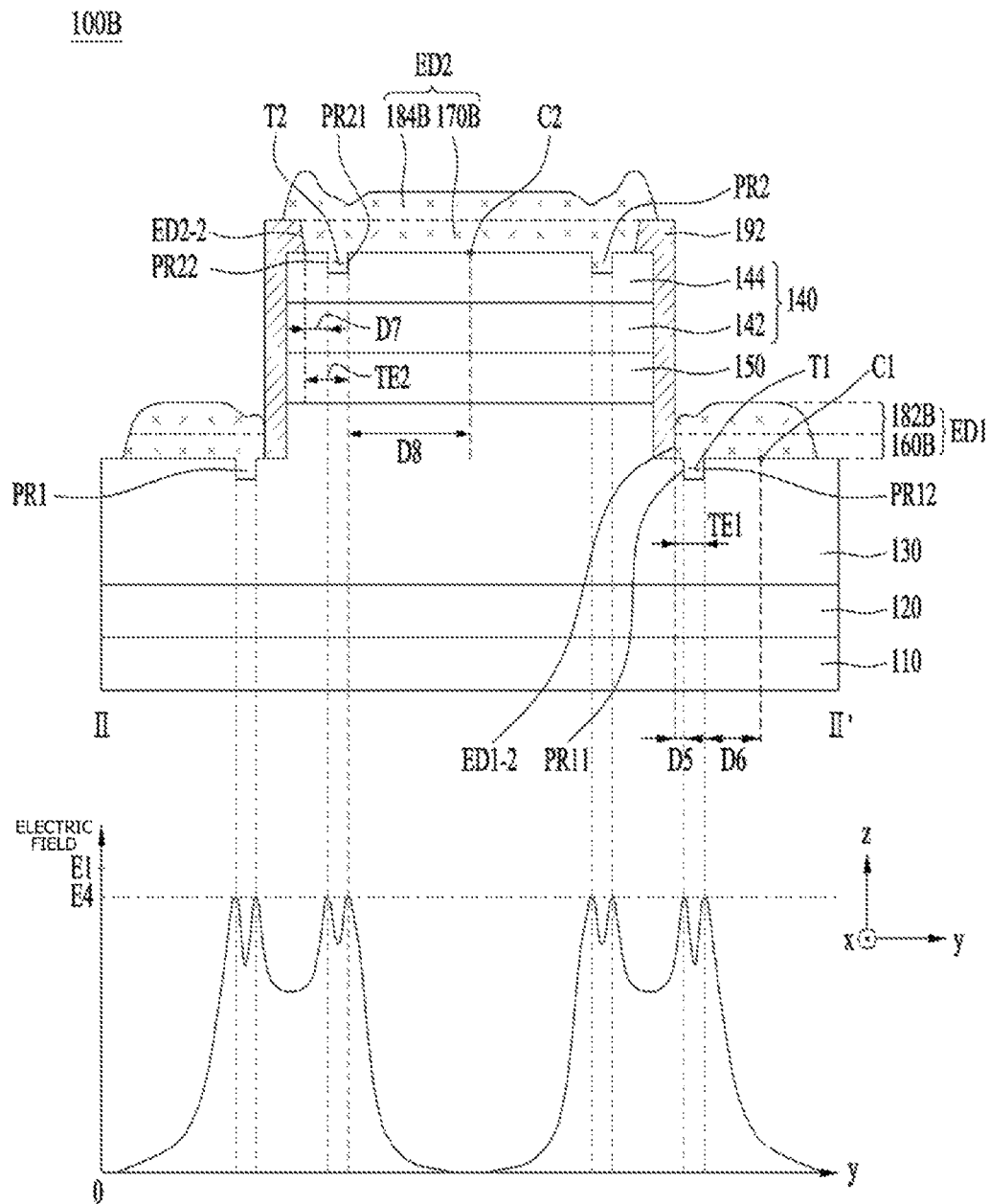

[FIG. 6]
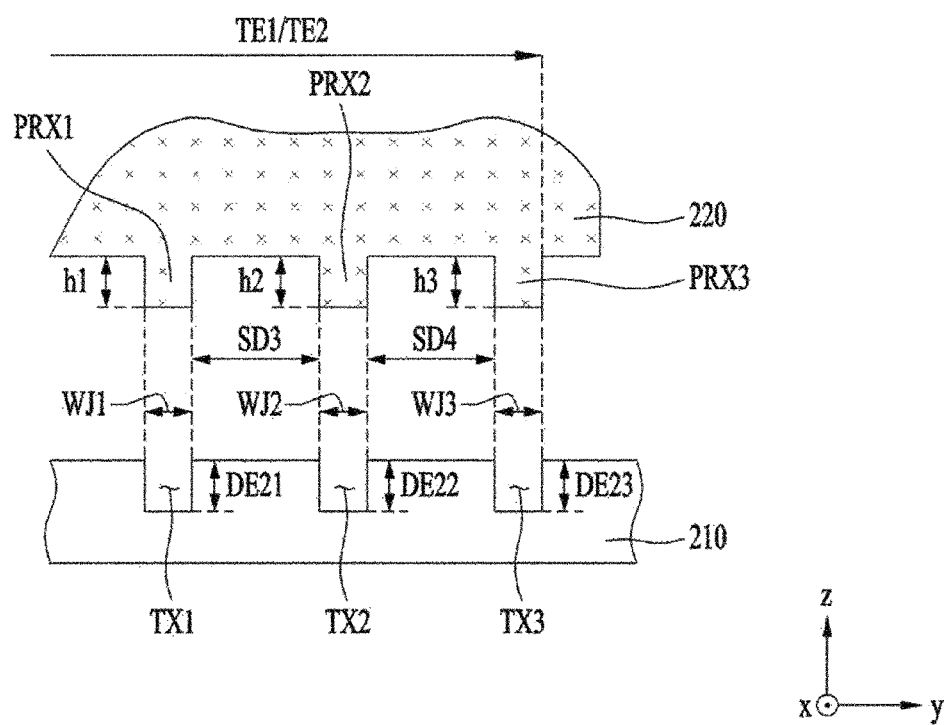

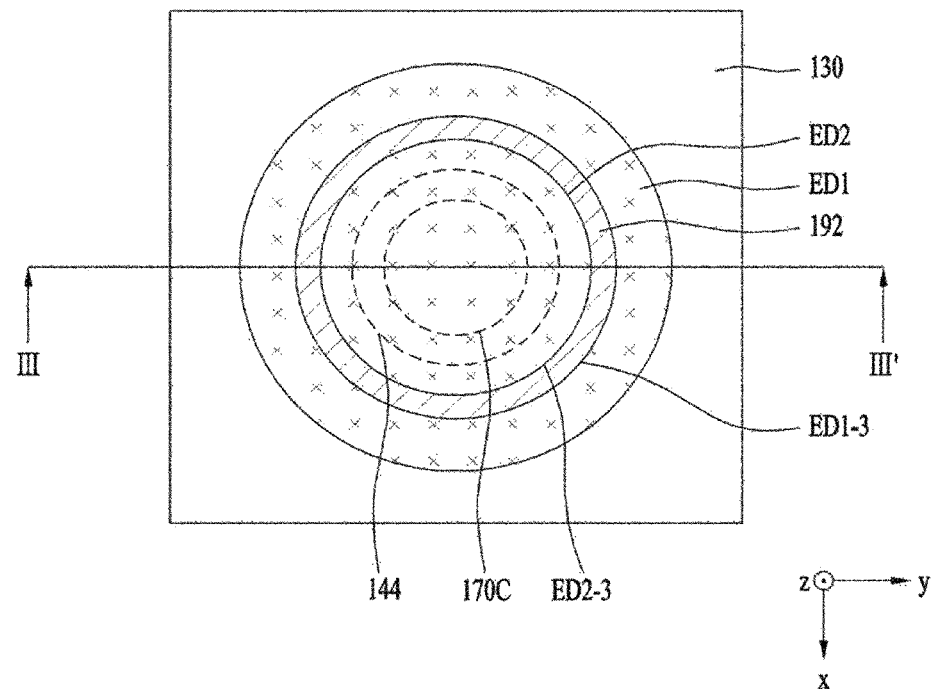

[FIG. 8]
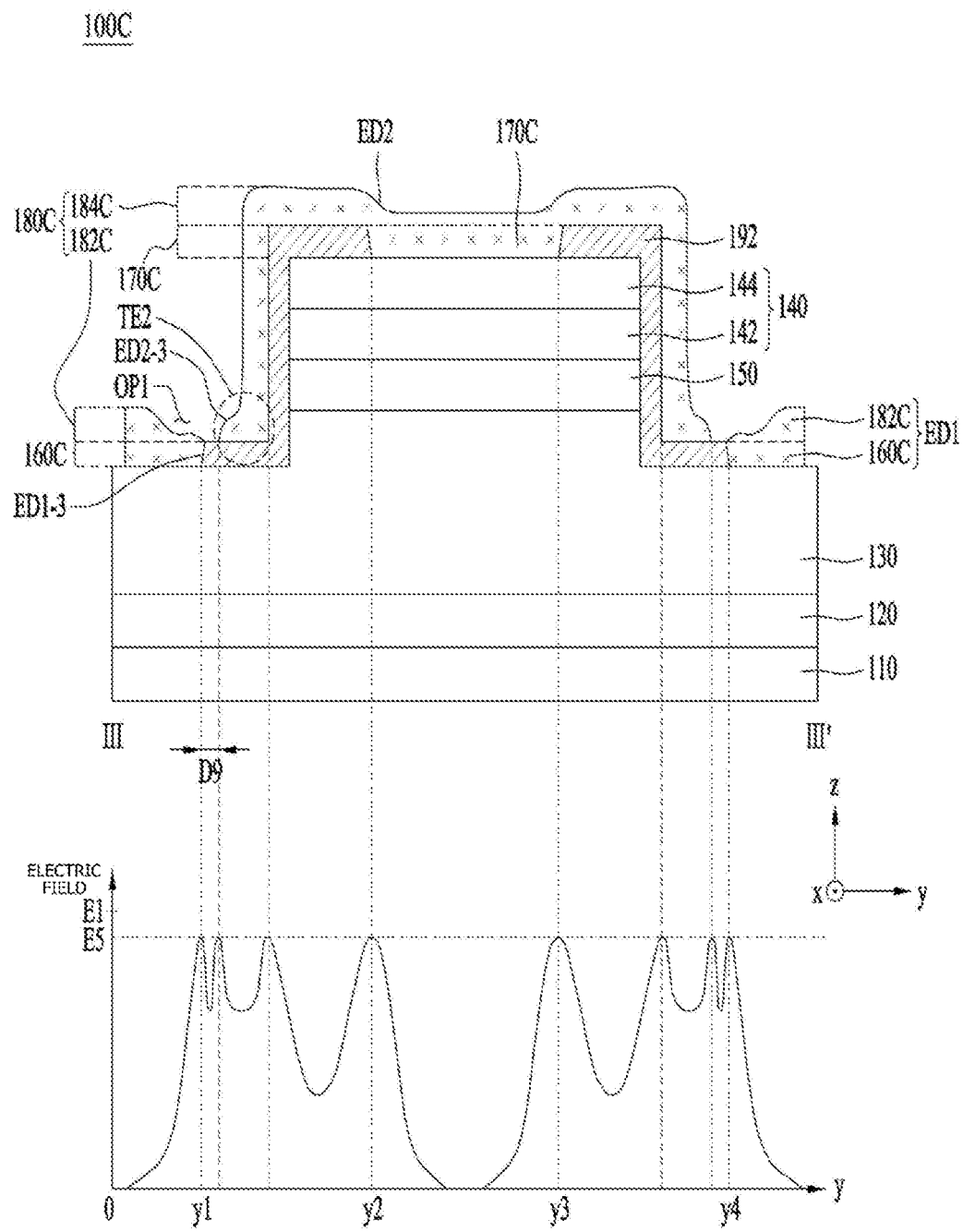

[FIG. 9]
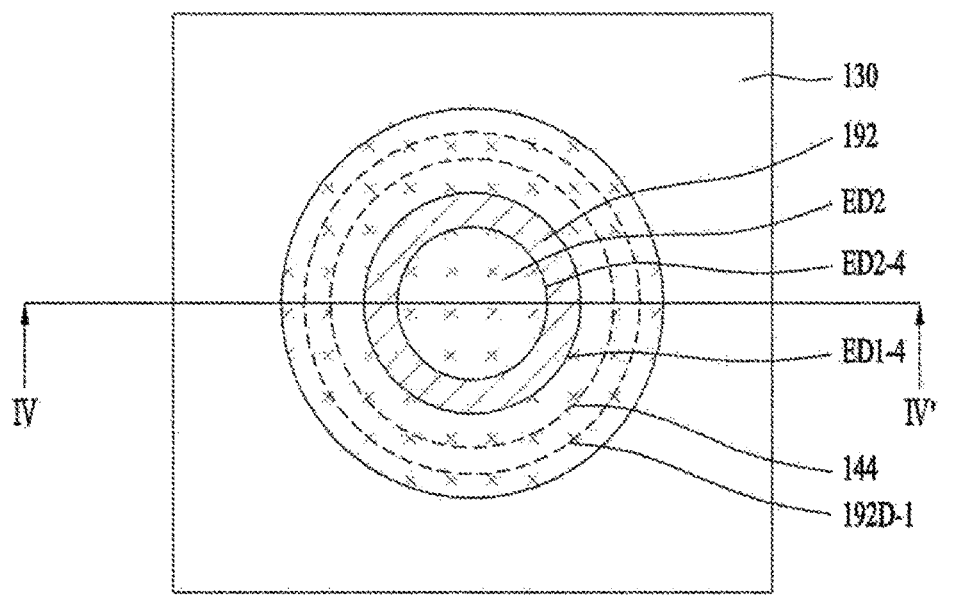

[FIG. 10]
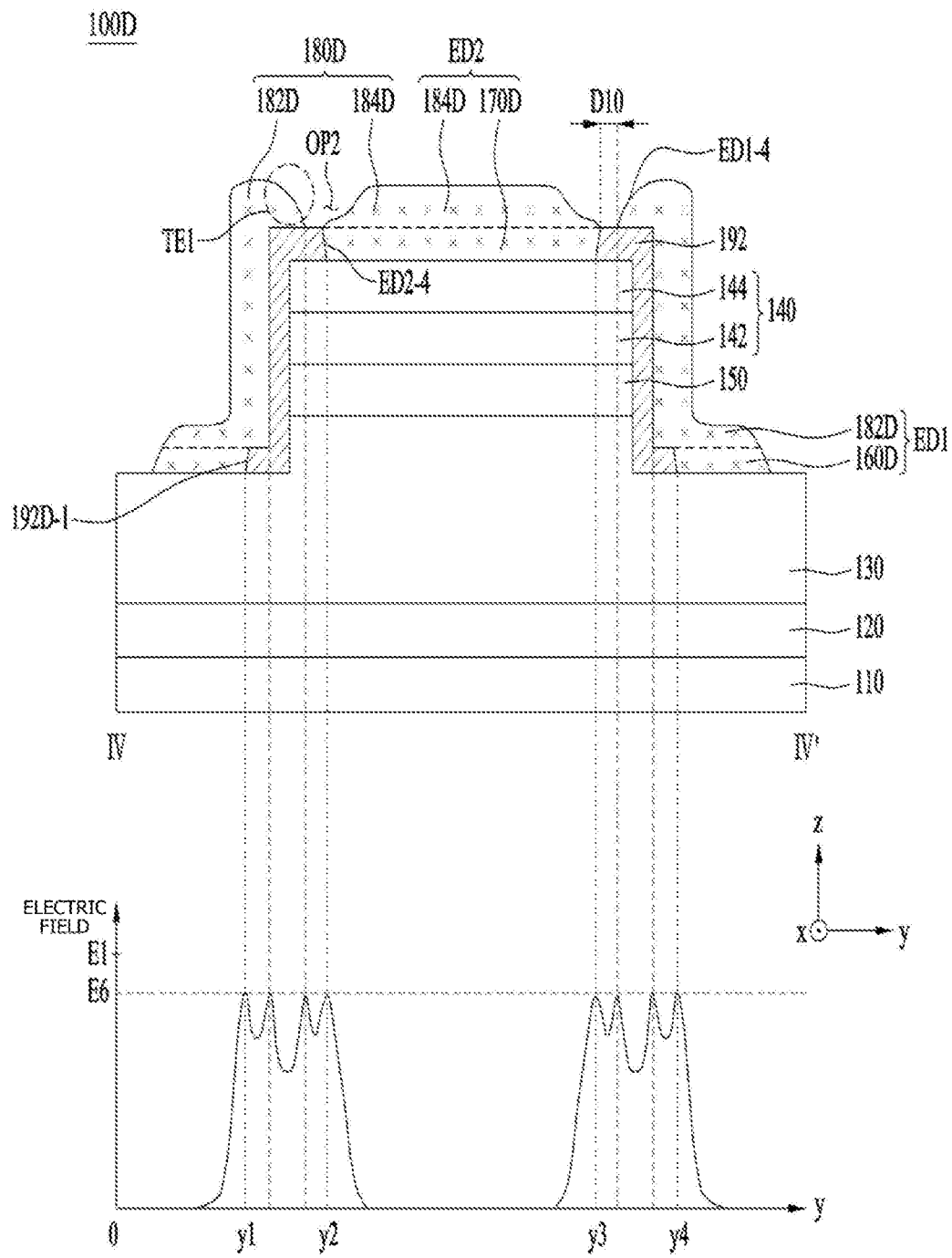

[FIG. 11]
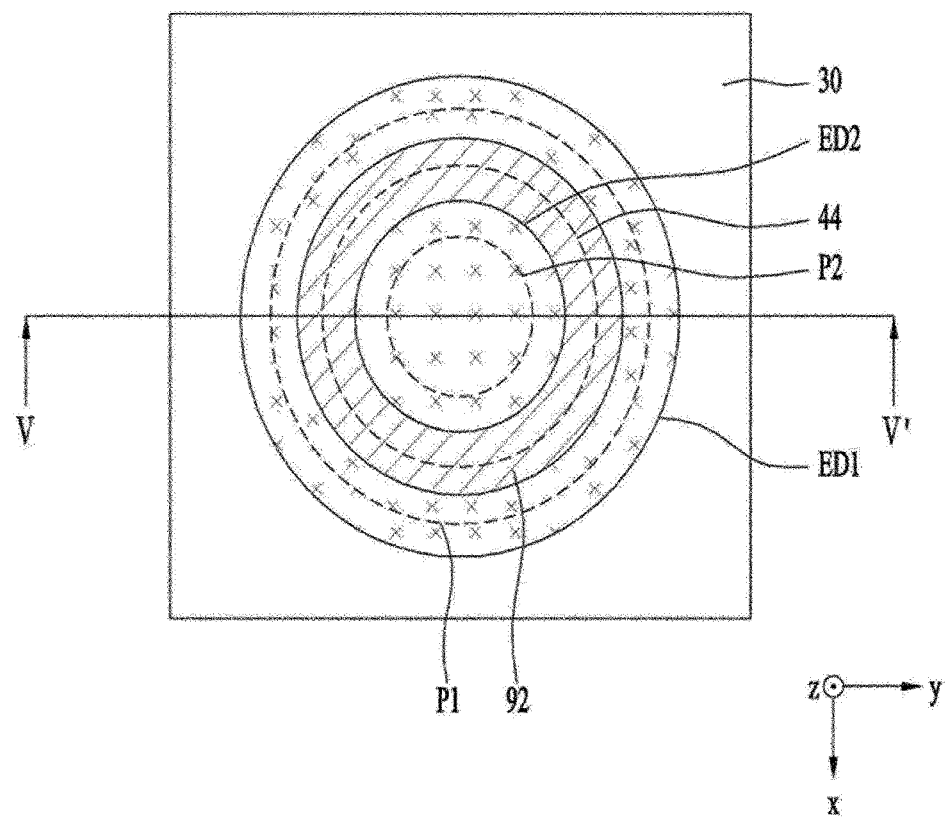

[FIG. 12]
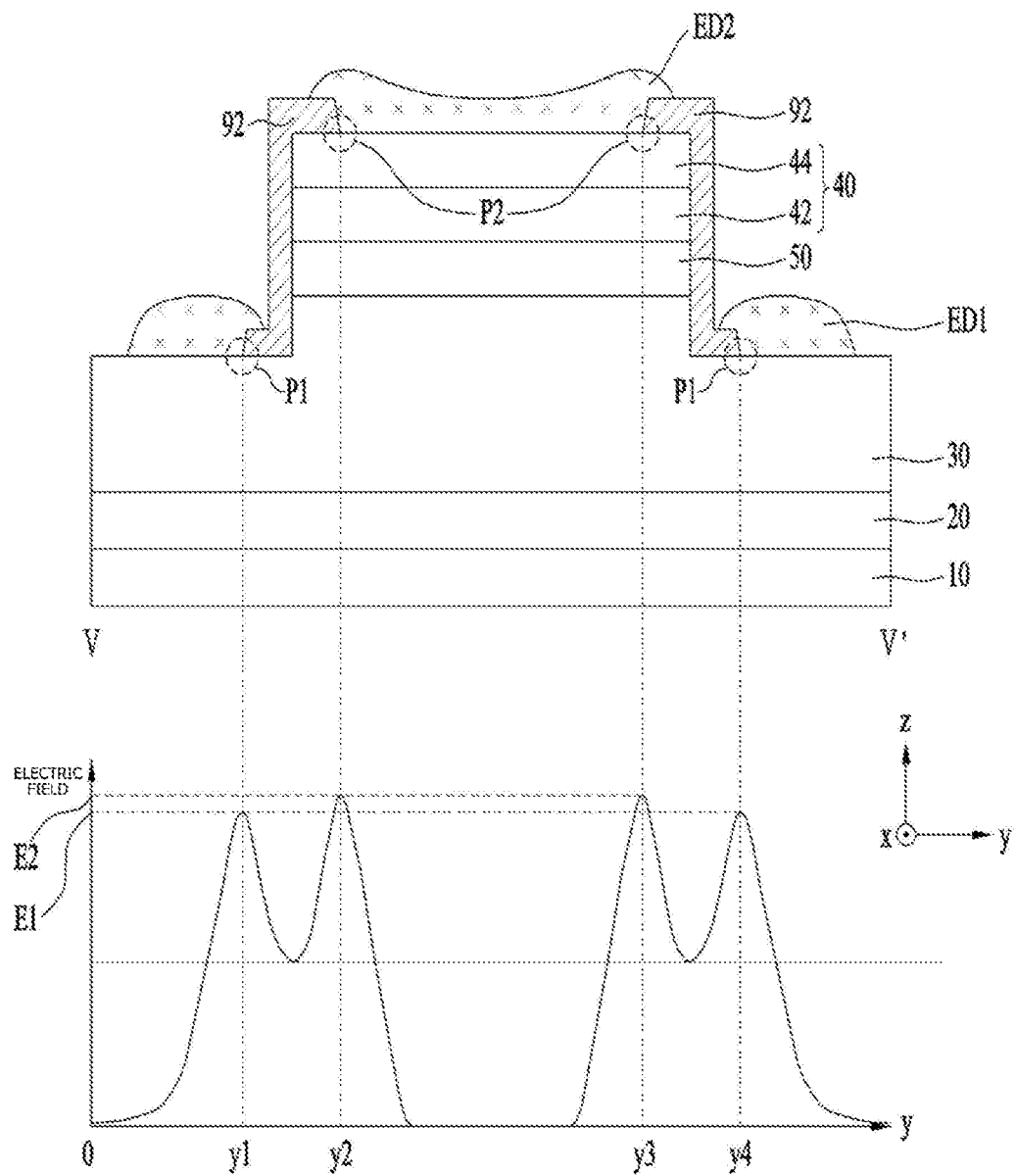

[FIG. 13A]
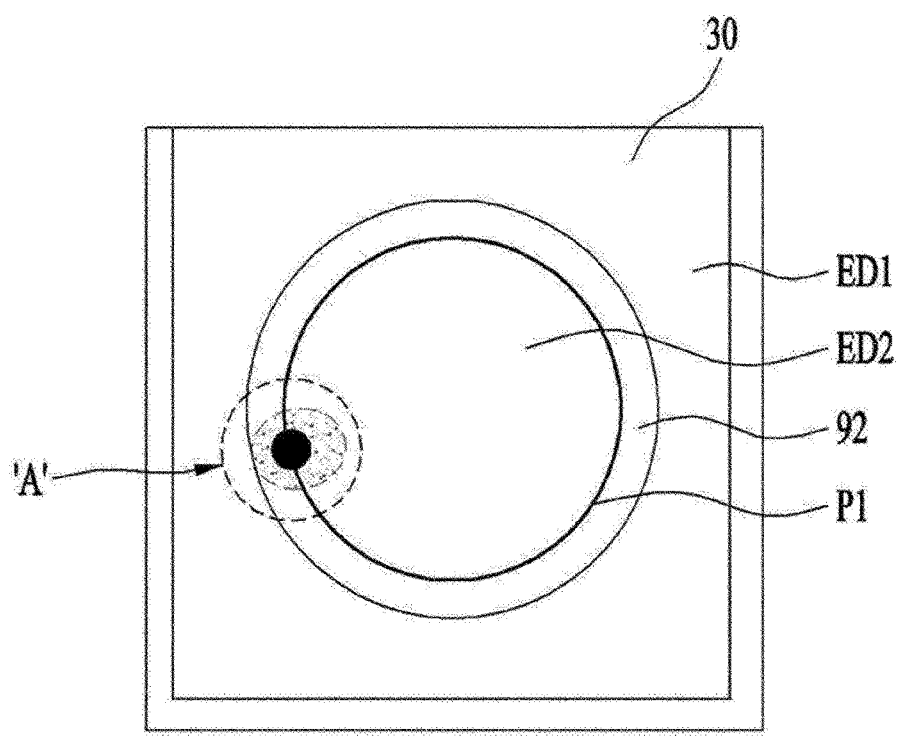

[FIG. 13B]
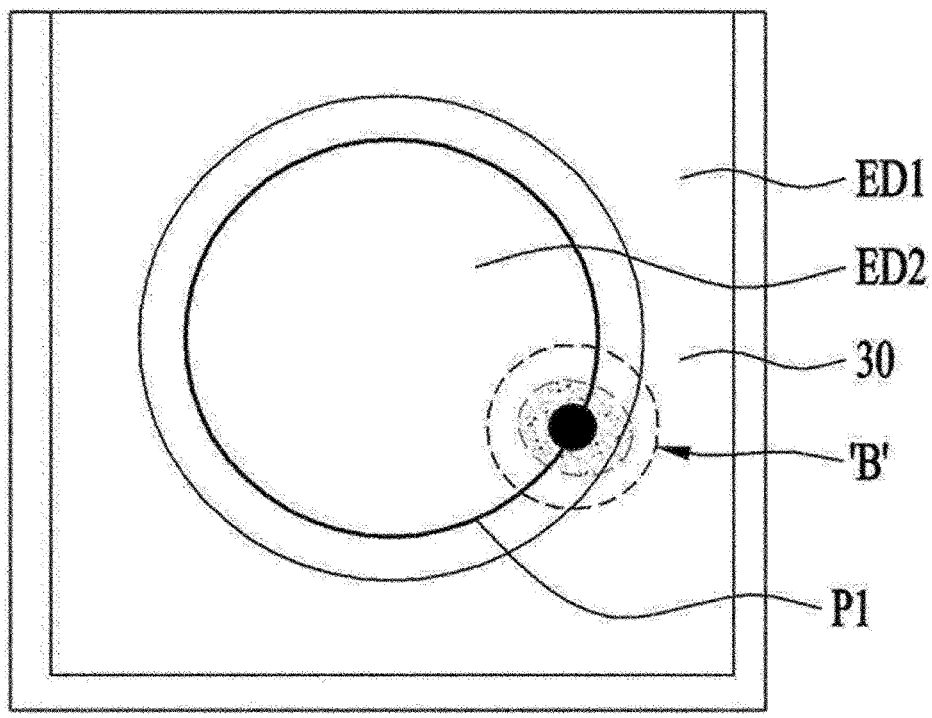

SEMICONDUCTOR DEVICE WITH ELECTRIC FIELD DISTRIBUTION PART

CROSS REFERENCE TO RELATED APPLICATIONS

This application is the National Phase of PCT International Application No. PCT/KR2017/006205, filed on Jun. 14, 2017, which claims priority under 35 U.S.C. 119(a) to Patent Application No. 10-2016-0074006, filed in the Republic of Korea on Jun. 14, 2016, all of which are hereby expressly incorporated by reference into the present application.

TECHNICAL FIELD

Embodiments relate to a semiconductor device.

BACKGROUND ART

Semiconductor devices including compounds such as GaN, AlGaN, and the like have many advantages of wide and easily adjustable bandgap energy and the like such that the semiconductor devices may be variously used as light-emitting devices, light-receiving devices, various diodes, and the like.

In particular, a light-emitting device such as a light-emitting diode (LED) or a laser diode using a compound semiconductor material of a Group III-V or II-VI compound semiconductor can implement various color light such as red light, green light, blue light, and ultraviolet rays with development of a thin film growth technique and an element material, can also implement white light with high efficiency using a fluorescent material or combining colors, and has advantages of low power consumption, a semi-permanent lifetime, a fast response speed, safety, and environmental friendliness as compared to conventional light sources such as fluorescent lamps and incandescent lamps.

In addition, when a light-receiving device such as a photodetector or a solar cell is manufactured using a Group III-V or II-VI compound semiconductor material, due to development of an element material, the light-receiving device absorbs light of various wavelength regions to generate a photoelectric current such that light in various wavelength regions from gamma rays to a radio wavelength range can be detected. Further, such a light-receiving device has advantages of a fast response speed, safety, environmental friendliness, and easy control of device materials such that the light-receiving device can also be easily used as various sensors for power control, a microwave circuit, a communication module, or detection of a gas or ultraviolet (UV) rays.

Accordingly, applications of the semiconductor device have expanded to being applied as a transmission module of an optical communication device, an LED backlight replacing a cold cathode fluorescent lamp (CCFL) which configures a backlight of a liquid crystal display (LCD) device, a white LED lighting device capable of replacing a fluorescent lamp or an incandescent lamp, a headlight of a vehicle, traffic lights, a sensor for detecting a gas or fire, and the like. Further, applications of the semiconductor device can be expanded as being applied to a high frequency application circuit, other power control device, and a communication module.

In the conventional semiconductor device, an electric field is strongly formed at an edge of an electrode such that there is a problem in that the semiconductor device can be damaged.

DISCLOSURE

Technical Problem

Exemplary embodiments are directed to providing a semiconductor device with improved reliability by distributing a locally large electric field.

Technical Solution

One aspect of the present invention provides a semiconductor device including a substrate, first and second semiconductor layers disposed on the substrate and having different conductivity types, a third semiconductor layer disposed between the first semiconductor layer and the second semiconductor layer, a first electrode disposed on the first semiconductor layer, a second electrode disposed on the second semiconductor layer, and a first insulating layer disposed on at least one among the first, second, and third semiconductor layers exposed between the first electrode and the second electrode, wherein at least one of a first end part among both end parts of the first electrode, which is close to the second electrode, and a second end part among both end parts of the second electrode may have an electric field distribution part.

The electric field distribution part may include at least one cavity in contact with the first or second semiconductor layer.

The semiconductor device may further include a second insulating layer disposed within the at least one cavity.

A first distance from the at least one cavity in contact with the first semiconductor layer to an edge of the first end part may be shorter than a second distance from the at least one cavity in contact with the first semiconductor layer to a center of the first electrode.

A third distance from the at least one cavity in contact with the second semiconductor layer to an edge of the second end part may be shorter than a fourth distance from the at least one cavity in contact with the second semiconductor layer to a center of the second electrode.

The at least one cavity may include a plurality of cavities, and one or more among separation distances, by which the plurality of cavities are spaced apart from one another, and widths or depths of the plurality of cavities may be different.

The electric field distribution part may include at least one protrusion protruding toward the first or second semiconductor layer.

A fifth distance from the at least one protrusion protruding toward the first semiconductor layer to an edge of the first end part may be shorter than a sixth distance from the at least one protrusion protruding toward the first semiconductor layer to a center of the first electrode.

A seventh distance from the at least one protrusion protruding toward the second semiconductor layer to an edge of the second end part may be shorter than an eighth distance from the at least one protrusion protruding toward the second semiconductor layer to a center of the second electrode.

The fifth distance or the seventh distance may be in the range of 1 μm to 5 μm.

The number of the at least one protrusion may be in the range of 1 to 5. The at least one protrusion may include a plurality of protrusions, and one or more among separation distances, by which the plurality of protrusions are spaced apart from one another, and widths or depths of the plurality of protrusions may be different.

The electric field distribution part included in the second end part may have an edge spaced a ninth distance from a first interface between the first electrode and the first insulating layer and overlap the first insulating layer and the first semiconductor layer in a vertical direction.

The electric field distribution part included in the first end part may have an edge spaced a tenth distance from a second interface between the first insulating layer and the second electrode and overlap the first insulating layer and the first to third semiconductor layers in the vertical direction.

The first end part and the second end part may be disposed to face each other on the first semiconductor layer.

The first end part and the second end part may be disposed to face each other on the second semiconductor layer.

The ninth distance or the tenth distance may be in the range of 1 μm to 5 μm.

The first electrode may include a first ohmic layer disposed on the first semiconductor layer, and a first metal layer disposed on the first ohmic layer.

The first ohmic layer and the first metal layer may be integrated.

The second electrode may include a second ohmic layer disposed on the second semiconductor layer, and a second metal layer disposed on the second ohmic layer.

The second ohmic layer and the second metal layer may be integrated.

The first insulating layer may include at least one among a first insulating part disposed on the first semiconductor layer, a second insulating part disposed on the second semiconductor layer, and a third insulating part disposed at lateral parts of the first to third semiconductor layers between the first and second insulating parts.

Advantageous Effects

A semiconductor device according to the embodiments can provide high reliability by distributing a locally large electric field to prevent damage due to a strong electric field.

DESCRIPTION OF DRAWINGS

FIG. 1 is a plan view of a semiconductor device according to one embodiment.

FIG. 2 is a cross-sectional view taken along line I-I' shown in FIG. 1.

FIG. 3 is a partially exploded cross-sectional view of the semiconductor device shown in FIGS. 1 and 2 according to another embodiment.

FIG. 4 is a plan view of a semiconductor device according to another embodiment.

FIG. 5 is a cross-sectional view taken along line II-IP shown in FIG. 4.

FIG. 6 is a partially exploded cross-sectional view of the semiconductor device shown in FIGS. 4 and 5 according to another embodiment.

FIG. 7 is a plan view of a semiconductor device according to still another embodiment.

FIG. 8 is a cross-sectional view taken along line shown in FIG. 7.

FIG. 9 is a plan view of a semiconductor device according to yet another embodiment.

FIG. 10 is a cross-sectional view taken along line IV-IV' shown in FIG. 9.

FIG. 11 is a plan view of a semiconductor device according to Comparative Example.

FIG. 12 is a cross-sectional view of the semiconductor device taken along line V-V' shown in FIG. 11.

FIGS. 13A and 13B are photographs of an actual light-emitting device according to Comparative Example shown in FIG. 11.

MODES OF THE INVENTION

Hereinafter, exemplary embodiments of the present invention capable of realizing the above-described objectives will be described with reference to the accompanying drawings.

In the description of the embodiments according to the present invention, when an element is described as being formed "on" or "under" another element, the terms "on" or "under" includes the meaning of the two elements being in direct contact with each other (directly) and the meaning of one or more other elements being disposed and formed between the two elements (indirectly). Further, when an element is described as being formed "on" or "under" another element, the description may include the meaning of the other element being formed in an upward direction of the element and formed in a downward direction of the element.

A semiconductor device may include various electronic devices such as a light-emitting device and a light-receiving device. Both of the light-emitting device and the light-receiving device may include first and second semiconductor layers and a third semiconductor layer (or an active layer) having different conductivity types.

The light-emitting device emits light by recombination of electrons and holes, and a wavelength of the light is determined by an inherent energy band gap of a material. Thus, the emitted light may be varied according to a composition of the material.

The light-emitting device may be used as a light source of a lighting system by being configured as a light-emitting device package. For example, the light-emitting device package may be used as a light source of an image display device or a lighting device.

When the light-emitting device package is used as a backlight unit of the image display device, the light-emitting device package may be used as an edge-type backlight unit or a direct-type backlight unit. When the light-emitting device package is used as a light source of the lighting device, the light-emitting device package may be used as a lamp instrument or may be used in the form of a bulb type, and the light-emitting device package may also be used as a light source of a mobile terminal.

The light-emitting device includes a light-emitting diode or a laser diode.

The light-emitting diode may include the above-described structure of the first semiconductor layer, the second semiconductor layer, and the third semiconductor layer. The light-emitting diode and the laser diode are the same in that an electro-luminescence (electric field light emission) phenomenon in which light is emitted when a first p-type semiconductor layer and a second n-type semiconductor layer are bonded and a current flows is used, but the light-emitting diode and the laser diode are different in directivity and phase of the emitted light. That is, the laser diode may emit light having the same phase in the same direction at a specific single wavelength (i.e., a monochromatic beam) using a phenomenon referred to as stimulated emission and a constructive interference phenomenon, and, with the above-described characteristic, the laser diode may be used for optical communication, medical equipment, semiconductor processing equipment, and the like.

Meanwhile, an example of the light-receiving device may include a photodetector which is a kind of transducer that detects light and converts an intensity of the detected light into an electric signal. Such a photodetector may include a photocell (silicon or selenium), a photoconductive element (cadmium sulfide or cadmium selenide), a photodiode (PD) (e.g., a PD having a peak wavelength in a visible blind spectral region or in a true blind spectral region), a phototransistor, a photomultiplier, a photoelectric tube (vacuum or gas filling), an infra-red (IR) detector, or the like, but the present invention is not limited thereto.

Further, the semiconductor device such as the photodetector may be manufactured using a direct bandgap semiconductor of which photoconversion efficiency is generally high. Alternatively, the photodetector has a variety of structures, and includes a pin-type photodetector using a pn junction which is a most general structure, a Schottky photodetector using a Schottky junction, and a metal-semiconductor-metal (MSM) type photodetector.

Like the light-emitting device, the light-receiving device such as the PD may include the above-described structure of the first semiconductor layer, the second semiconductor layer, and the third semiconductor layer and may be configured with a pn junction or a pin structure. The photodiode operates by applying a reverse bias or a zero bias, and, when light is incident into the photodiode, electrons and holes are generated and thus a current flows. At this point, an amount of the current may be approximately proportional to an intensity of the light incident into the photodiode.

A photovoltaic cell or a solar cell is a kind of a photodiode and may convert light into a current. Like the light-emitting device, the solar cell may include the first semiconductor layer, the second semiconductor layer, and the third semiconductor layer.

Further, the photodiode (PD) may be used as a rectifier of an electronic circuit through a rectifying characteristic of a general diode using a pn junction, and may be applied to an oscillation circuit and the like by being employed in a microwave circuit.

Further, the above-described semiconductor device is not necessarily implemented with a semiconductor, and in some cases, the semiconductor device may further include a metal material. For example, the semiconductor device such as the light-receiving device may be implemented using at least one among Ag, Al, Au, In, Ga, N, Zn, Se, and As or may also be implemented using a semiconductor material doped with a p-type or n-type dopant or an intrinsic semiconductor material.

Hereinafter, the semiconductor device according to exemplary embodiments will be described using an orthogonal coordinates system (x, y, z), but these exemplary embodiments are not limited thereto. That is, the exemplary embodiments may be described using other coordinates systems. In the drawings, an x-axis, a y-axis, and a z-axis will be described as being perpendicular to one other, but the exemplary embodiments are not limited thereto. That is, the x-axis, the y-axis, and the z-axis may intersect with one another without being perpendicular to one other.

Further, semiconductor devices 100A to 100D according to the exemplary embodiments, which will be described below, mean a light-receiving device, but the exemplary embodiments are not limited thereto. That is, the semiconductor devices 100A to 100D according to the exemplary embodiments may be a light-emitting device. In particular, the semiconductor devices according to the exemplary embodiments may be an avalanche photodiode (APD) for improving the gain by multiplying carriers, but the exemplary embodiments are not limited thereto.

FIG. 1 is a plan view of a semiconductor device 100A according to one embodiment, and FIG. 2 is a cross-sectional view taken along line I-I' shown in FIG. 1.

The semiconductor device 100A shown in FIG. 1 may have a cross-sectional shape different from that shown in FIG. 2, and the semiconductor device 100A shown in FIG. 2 may have a planar shape different from that shown in FIG. 1.

To help understanding, invisible layers disposed below a first electrode ED1 and a second electrode ED2 in FIG. 1 are indicated by dotted lines.

Referring to FIGS. 1 and 2, the semiconductor device 100A according to one embodiment may include a substrate 110, a buffer layer 120, a first semiconductor layer 130, a second semiconductor layer 140, a third semiconductor layer 150, the first and second electrodes ED1 and ED2, a first insulating layer 192, and second insulating layers 194 and 196.

The substrate 110 may include a conductive material or a non-conductive material. For example, the substrate 110 may include at least one among sapphire ($Al_2O_3$), GaN, SiC, ZnO, GaP, InP, $Ga_2O_3$, GaAs, and Si, but the present embodiment is not limited to a particular material of the substrate 110.

A light-receiving structure may include the first to third semiconductor layers 130, 140, and 150. When the semiconductor device 100A according to the present embodiment is a light-emitting device, the first to third semiconductor layers 130, 140, and 150 may be a light-emitting structure.

In order to improve a difference in a thermal expansion coefficient and a lattice mismatch between the substrate 110 and the light-receiving structure 130, 140, and 150, the buffer layer 120 may be disposed between the substrate 110 and the first semiconductor layer 130. In some cases, the buffer layer 120 may be omitted. For example, the buffer layer 120 may include at least one material selected from the group consisting of Al, In, N, and Ga, but the present invention is not limited thereto. Further, the buffer layer 120 may have a single layer structure or a multi-layered structure. For example, the buffer layer 120 may be made of AlN.

The first and second semiconductor layers 130 and 140 may be disposed on the substrate 110. The first and second semiconductor layers 130 and 140 may have different conductivity types. For example, the first semiconductor layer 130 may be a first conductive semiconductor layer doped with a first conductive dopant, and the second semiconductor layer 140 may be a second conductive semiconductor layer doped with a second conductive dopant.

Alternatively, the first semiconductor layer 130 may be a semiconductor layer doped with a second conductive dopant, and the second semiconductor layer 140 may include a semiconductor layer doped with a first conductive dopant. Here, the first conductive type dopant may include Si, Ge, Sn, Se, or Te as an n-type dopant, but the present invention is not limited thereto. Further, the second conductive dopant may include Mg, Zn, Ca, Sr, or Ba as a p-type dopant, but the present invention is not limited thereto.

The first semiconductor layer 130 may be disposed on the substrate 110 (or the buffer layer 120). The first semiconductor layer 130 may be disposed between the substrate 110 (or the buffer layer) and the third semiconductor layer 150. When the buffer layer 120 is not omitted, the first semiconductor layer 130 may be disposed between the buffer layer 120 and the third semiconductor layer 150.

The second semiconductor layer 140 may be disposed on the third semiconductor layer 150. The second semiconductor layer 140 may be disposed between the third semiconductor layer 150 and the second electrode ED2.

The second semiconductor layer 140 may be formed by stacking a plurality of semiconductor layers. For example, the second semiconductor layer 140 may include a second-first semiconductor layer 142 and a second-second semiconductor layer 144.

The second-first semiconductor layer 142 may be disposed between the third semiconductor layer 150 and the second-second semiconductor layer 144. The second-second semiconductor layer 144 may be disposed between the second-first semiconductor layer 142 and the second electrode ED2, but the present embodiment is not limited thereto.

According to another embodiment, the second-first semiconductor layer 142 may have a conductivity type identical to that of the first semiconductor layer 130. For example, when the first semiconductor layer 130 is an n-type semiconductor layer, the second-first semiconductor layer 142 may be an n-type semiconductor layer. In this case, the second-first semiconductor layer 142 may have a second doping concentration N2 that is lower than a first doping concentration N1 of the first semiconductor layer 130.

Further, as shown in FIG. 2, the second semiconductor layer 140 of the semiconductor device 100A is illustrated as including both of the second-first and second-second semiconductor layers 142 and 144, but the present embodiment is not limited thereto. That is, according to another embodiment, the second semiconductor layer 140 may include only the second-first or second-second semiconductor layer 142 or 144, or may further include a second-third semiconductor layer (not shown).

The third semiconductor layer 150 may be disposed between the first semiconductor layer 130 and the second semiconductor layer 140. When the semiconductor device 100A is a light-receiving device, the third semiconductor layer 150 serves to absorb photons, whereas when the semiconductor device 100A is a light-emitting device, the third semiconductor layer 150 serves to emit light.

When the semiconductor device 100A is the light-receiving device, the third semiconductor layer 150 may include an intrinsic semiconductor layer. Here, the intrinsic semiconductor layer may be an undoped semiconductor layer or an unintentionally doped semiconductor layer. The unintentionally doped semiconductor layer may mean that an N-vacancy occurs during a semiconductor layer growth process without doping a dopant, e.g., an n-type dopant such as silicon (Si) atoms or the like. In this case, when the number of N vacancies increases, a concentration of extra electrons is increased such that the semiconductor layer may have an electrical characteristic similar to that when being doped with the n-type dopant although doping of the n-type dopant is not unintended in a manufacturing process.

For example, each of the first semiconductor layer 130, the second-first and second-second semiconductor layers 142 and 144, and the third semiconductor layer 150 may be formed of a semiconductor compound and may include a semiconductor material having a composition formula of $In_xAl_yGa_{1-x-y}N$ ($0 \leq x \leq 1$, $0 \leq y \leq 1$, and $0 \leq x+y \leq 1$) or one or more among InAlAs, GaN, InN, AlN, InGaN, AlGaN, InAlGaN, AlInN, AlGaAs, InGaAs, AlInGaAs, GaP, AlGaP, InGaP, AlInGaP, and InP.

For example, the first semiconductor layer 130 may include n-type AlGaN, the second-first semiconductor layer 142 may include p-type AlGaN, the second-second semiconductor layer 144 may include $p^+$-type GaN, and the third semiconductor layer 150 may include i-AlGaN (or n-type AlGaN).

Alternatively, the second-first semiconductor layer 142 of the second semiconductor layer 140 may include n-type AlGaN instead of p-type AlGaN.

Alternatively, the first semiconductor layer 130 may include n-type InP, the second semiconductor layer 140 may include p-type InP, and the third semiconductor layer 150 may include undoped InGaAs. In this case, the second-first semiconductor layer 142 of the second semiconductor layer 140 may include p-type or n-type InP.

When the second-first semiconductor layer 142 has a conductivity type different from that of the second-second semiconductor layer 144, a depletion region between the second-first semiconductor layer 142 and the second-second semiconductor layer 144 may serve to multiply carriers. Further, a strong electric field is generated at a boundary between the second-first semiconductor layer 142 and the third semiconductor layer 150 and at the second-first semiconductor layer 142 adjacent to the boundary, and carriers (e.g., electrons) continuously generate other carriers in the second-first semiconductor layer 142 due to the strong electric field and a current is amplified to cause an avalanche such that a gain of the semiconductor device 100A may be improved.

Alternatively, when the second-first semiconductor layer 142 includes p-AlGaN, the second-second semiconductor layer 144 may include p-GaN for ohmic bonding. In this case, an Al content of the second-second semiconductor layer 144 may be less than an Al content of the second-first semiconductor layer 142. With such a configuration, resistance is lowered such that an amount of a current injection may be increased. Meanwhile, the first electrode ED1 may be disposed on the first semiconductor layer 130 which is exposed by mesa-etching the second and third semiconductor layers 140 and 150. The first electrode ED1 may be electrically connected to the first semiconductor layer 130. The second electrode ED2 may be disposed on the second semiconductor layer 140. The second electrode ED2 may be electrically connected to the second semiconductor layer 140.

Further, the first electrode ED1 may be disposed to extend to an upper surface of the first insulating layer 192 disposed on the first semiconductor layer 130, and the second electrode ED2 may be disposed to extend to the first insulating layer 192 disposed on the second semiconductor layer 140, but the present embodiment is not limited thereto.

Furthermore, the first electrode ED1 may include a first ohmic layer 160A and a first metal layer 182A. The first metal layer 182A may be disposed on the first ohmic layer 160A. As shown in FIG. 2, the first ohmic layer 160A may be disposed on the first semiconductor layer 130.

As shown in FIG. 2, when the first ohmic layer 160A and the first metal layer 182A are separately implemented as indicated by dotted lines, the first metal layer 182A may serve to cap (or cover) the first ohmic layer 160A, but the present embodiment are not limited thereto. According to another embodiment, as shown in FIG. 2, the first ohmic layer 160A and the first metal layer 182A may be integrally formed.

The second electrode ED2 may include a second ohmic layer 170A and a second metal layer 184A. The second metal layer 184A may be disposed on the second ohmic layer 170A. As shown in FIG. 2, the second ohmic layer 170A may be disposed on the second semiconductor layer 140.

As shown in FIG. 2, when the second ohmic layer 170A and the second metal layer 184A are separately implemented as indicated by dotted lines, the second metal layer 184A may serve to cap the second ohmic layer 170A, but the present embodiment are not limited thereto. According to another embodiment, as shown in FIG. 2, the second ohmic layer 170A and the second metal layer 184A may be integrally formed.

Each of the first ohmic layer 160A and the second ohmic layer 170A may include an ohmic contact material and may be a transparent conductive oxide (TCO) layer. For example, each of the first ohmic layer 160A and the second ohmic layer 170A may be formed of at least one among an indium tin oxide (ITO), an indium zinc oxide (IZO), an indium zinc tin oxide (IZTO), an indium aluminum zinc oxide (IAZO), an indium gallium zinc oxide (IGZO), an indium gallium tin oxide (IGTO), an aluminum zinc oxide (AZO), an antimony tin oxide (ATO), a gallium zinc oxide (GZO), an IZO nitride (IZON), Al—Ga ZnO (AGZO), IGZO, ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present invention is not limited thereto.

Alternatively, each of the first ohmic layer 160A and the second ohmic layer 170A may be formed of a metal selected from among Ag, Ni, Ti, Al, Rh, Pd, Ir, Ru, Mg, Zn, Pt, Au, Hf, Cr, and a selective combination thereof, but the present embodiment is not limited thereto and various metal materials may be included.

Further, each of the first and second metal layers 182A and 184A may be made of a material having high electrical conductivity. For example, each of the first and second metal layers 182A and 184A may selectively include at least one selected from the group consisting of Ti, Au, Ni, In, Co, W, Fe, Rh, Cr, Al, and the like, but the present invention is not limited thereto.

The first insulating layer 192 may be disposed on at least one among the first, second, and third semiconductor layers 130, 140, and 150 exposed between the first electrode ED1 and the second electrode ED2. That is, the first insulating layer 192 may be disposed on a lateral part and an upper portion of the light-receiving structure exposed by mesa-etching. For example, the first insulating layer 192 may be disposed on the first semiconductor layer 130 together with the first electrode ED1. Further, the first insulating layer 192 may be disposed on lateral parts of the first to third semiconductor layers 130, 140, and 150 exposed by mesa-etching. Furthermore, the first insulating layer 192 may be disposed on the second semiconductor layer 140 together with the second electrode ED2.

The first insulating layer 192 may include at least one among first, second, and third insulating parts 192A, 192B, and 192C.

The first insulating part 192A may be disposed on the first semiconductor layer 130 exposed by mesa-etching. In FIG. 2, the first insulating part 192A has been illustrated as being disposed below the first electrode ED1, but the present embodiment is not limited thereto. That is, the first insulating part 192A may be disposed and spaced apart from the first electrode ED1 without being in contact therewith.

The second insulating part 192B may be disposed on the second semiconductor layer 140 together with the second ohmic layer 170A. In FIG. 2, the second insulating part 192B has been illustrated as being disposed below the second electrode ED2, but the present embodiment is not limited thereto. That is, the second insulating part 192B may be disposed and spaced apart from the second electrode ED2 without being in contact therewith.

The third insulating part 192C may be disposed between the first and second insulating parts 192A and 192B to connect the first insulating part 192A and the second insulating part 192B. The third insulating part 192C may be disposed on the lateral parts of the first to third semiconductor layers 130, 140, and 150 exposed by mesa-etching. The third insulating part 192C may be disposed to cover a lateral surface of the third semiconductor layer 150 exposed by mesa-etching.

The first to third insulating parts 192A to 192C are merely examples, and the semiconductor device 100A according to the present embodiment is not limited to a specific cross-sectional shape of the first insulating layer 192.

The first insulating layer 192 may be disposed as described above to prevent a problem in advance that the first electrode ED1 and the second electrode ED2 are electrically connected to each other in the manufacturing process.

Meanwhile, in the semiconductor device according to the present embodiment, an end part (hereinafter referred to as a "first end part") close to the second electrode ED2 among both end parts of the first electrode ED1, and at least one of both end parts of the second electrode ED2 (hereinafter referred to as a "second end part") may have an electric field distribution part (or an electric field distribution structure or a guarding structure).

Referring to FIG. 1, 4, 7, or 9, in the semiconductor device 100A, 100B, 100C, or 100D according to the exemplary embodiment, one end part of both end parts of the first electrode ED1 having an annular planar shape corresponds to a portion adjacent to an outer circumference and the other end part thereof corresponds to a portion adjacent to an inner circumference. In this case, the end part of the first electrode ED1 adjacent to the inner circumference corresponds to the first end part as the end part close to the second electrode ED2. Further, referring to FIG. 1, 4, 7, or 9, an outer side of a circle in the second electrode ED2 having a circular planar shape corresponds to the second end part close to the first electrode ED1.

As shown in FIG. 1, 4, 7, or 9, each of the first and second electrodes ED1 and ED2 of the semiconductor device 100A, 100B, 100C, or 100D according to the exemplary embodiment may have a circular or annular planar shape or may have a polygonal planar shape.

FIG. 3 is a partially exploded cross-sectional view of the semiconductor device 100A shown in FIGS. 1 and 2 according to another embodiment.

A reference numeral 210 in FIG. 3 may correspond to the first or second semiconductor layer 130 or 140, and a reference numeral 220 may correspond to the first or second electrode ED1 or ED2. That is, the reference numerals 210 and 220 may respectively correspond to the first semiconductor layer 130 and the first electrode ED1 or to the second semiconductor layer 140 and the second electrode ED2.

In the semiconductor device 100A according to one embodiment shown in FIGS. 1 and 2, the first end part of the first electrode ED1 may include at least one first cavity H1 in contact with the first semiconductor layer 130 as an electric field distribution part. The at least one first cavity H1 is a recessed portion in a thickness direction (e.g., the +z-axis direction) of the first semiconductor layer 130 or 210 and may be in contact with the first semiconductor layer 130. In this case, the second insulating layer 194 (hereinafter referred to as a "second-first insulating layer 194") may be disposed in the at least one first cavity H1. The second-first insulating layer 194 also serves an electric field distribution and thus may be included in the electric field distribution part.

As the first end part of the first electrode ED1 has the electric field distribution part, the second end part of the second electrode ED2 may also have an electric field distribution part as follows.

The second end part of the second electrode ED2 may include at least one second cavity H2 in contact with the second semiconductor layer 140 as the electric field distribution part. The at least one second cavity H2 is a recessed portion in a thickness direction (e.g., a +z-axis direction) of the second semiconductor layer 140 or 220 and may be in contact with the second semiconductor layer 140. In this case, the second insulating layer 196 (hereinafter referred to as a "second-second insulating layer 196") may be disposed in the at least one second cavity H2. The second-second insulating layer 196 may also serve as an electric field distribution and thus may be included in the electric field distribution part.

The second-first and second-second insulating layers 194 and 196 may be formed of the same material or different materials. Further, each of the second-first and second-second insulating layers 194 and 196 may be formed of a material the same as or different from that of the first insulating layer 192.

Each of the first, second-first, and second-second insulating layers 192, 194, and 196 may be formed of a non-conductive oxide or nitride, e.g., a silicon oxide ($SiO_2$) layer, an oxynitride layer, $Al_2O_3$, or an Al oxide layer, but the present embodiment is not limited thereto.

When the first electrode ED1 separately includes the first ohmic layer 160A and the first metal layer 182A, the first cavity H1 may be formed by splitting an end portion of the first ohmic layer 160A. Further, when the second electrode ED2 separately includes the second ohmic layer 170A and the second metal layer 184A, the second cavity H2 may be formed by splitting an end portion of the second ohmic layer 170A.

Referring to the plan view shown in FIG. 1, the number of each of first and second cavities H1 and H2 is illustrated as being one, but the present embodiment is not limited thereto. That is, according to another embodiment, the number of first and second cavities H1 and H2 may be two or more.

For example, referring to FIG. 3, the at least one first cavity H1 may include three first cavities HX1, HX2, and HX3. In this case, three second-first insulating layers 194-1, 194-2, and 194-3 may be respectively disposed in the three first cavities HX1, HX2, and HX3. Likewise, referring to FIG. 3, the at least one second cavity H2 may include three second cavities HX1, HX2, and HX3. In this case, three second-second insulating layers 196-1, 196-2, and 196-3 may be respectively disposed in the three second cavities HX1, HX2, and HX3.

Further, a first distance D1 from the at least one first cavity H1 in contact with the first semiconductor layer 130 or 210 to an edge ED1-1 of the first end of the first electrode ED1 may be shorter than a second distance D2 from the at least one first cavity H1 to a center C1 of the first electrode ED1. The fact that the first distance D1 is shorter than the second distance D2 means that the at least one first cavity H1 is disposed at the first end part of the first electrode ED1. Here, the first distance D1 may be measured from one surface H11 of the first cavity H1, and the second distance D2 may be measured from the other surface H12 of the first cavity H1. Here, the one surface H11 of the first cavity H1 may be an outer surface disposed in a direction from the first cavity H1 to the first insulating layer 192, and the other surface of the first cavity H1 may be a surface disposed in a direction opposite the one surface H11. However, the present embodiment is not limited thereto. That is, according to another embodiment, the first distance D1 may be measured from a center of the first cavity H1 or the other surface H12 thereof, and the second distance D2 may be measured from the center of the first cavity H1 or the one surface H11 thereof.

Referring to FIG. 2, a first end part TE1 of the first electrode ED1 may be defined as a region from the edge ED1-1 in contact with the first semiconductor layer 130 among edges of the first electrode ED1 to the other surface H12 of the first cavity H1. Alternatively, as shown in FIG. 3, when a plurality of the first cavities H1 are provided, the first end part TE1 of the first electrode ED1 may be defined as a region from the edge ED1-1 in contact with the first semiconductor layer 130 among the edges of the first electrode ED1 to the other surface H12 of the outermost first cavity HX3.

Further, a third distance D3 from the at least one second cavity H2 in contact with the second semiconductor layer 140 or 220 to an edge ED2-1 of the second end part of the second electrode ED2 may be shorter than a fourth distance D4 from the at least one second cavity H2 to a center C2 of the second electrode ED2. The fact that the third distance D3 is shorter than the fourth distance D4 means that the at least one second cavity 112 is disposed at the second end part of the second electrode ED2. Here, the third distance D3 may be measured from the other surface 1422 of the second cavity H2, and the fourth distance D4 may be measured from the one surface H21 of the second cavity H2. Here, the one surface 1121 of the second cavity H2 may be an outer surface disposed in a direction from the first insulating layer 192 to the second cavity H2, and the other surface of the first cavity H1 may be a surface disposed in a direction opposite the one surface 1421. However, the present embodiment is not limited thereto. That is, according to another embodiment, the third distance D3 may be measured from a center of the second cavity H2 or the one surface H21 thereof, and the fourth distance D4 may be measured from the center of the second cavity H2 or the other surface H22 thereof.

Referring to FIG. 2, a second end part TE2 of the second electrode ED2 may be defined as a region from the edge ED2-1 in contact with the second semiconductor layer 140 among edges of the second electrode ED2 to the one surface H21 of the second cavity H2. Further, when a second cavity 11X shown in FIG. 3 corresponds to another embodiment of a cavity located at a left side of two second cavities H2 disposed on the second semiconductor layer 140 shown in FIG. 2, and as shown in FIG. 3, a plurality of second cavities H2 are provided, the second end part TE2 of the second electrode ED2 may be defined as a region from the edge ED2-1 in contact with the second semiconductor layer 140 among the edges of the second electrode ED2 to the other surface H22 of the outermost second cavity HX3.

In the semiconductor device 100A shown in FIGS. 1 and 2, the electric field distribution part has been illustrated as being formed at both of the first end part TE1 of the first electrode ED1 and the second end part TE2 of the second electrode ED2, but the present embodiment is not limited thereto. Alternatively, according to another embodiment, the electric field distribution part may be formed at only the first end part TE1 or only the second end part TE2.

As shown in FIG. 3, when each of the first and second cavities H1 and 1-12 is configured with the plurality of cavities HX1, HX2, and HX3, separation distances SD1 and SD2 by which the plurality of cavities HX1, HX2, and HX3 are separated may be equal to or different from each other.

Further, widths WI1, WI2, and WI3 of the plurality of cavities HX1, HX2, and HX3 may be equal to or different from one another.

Furthermore, depths DE11, DE12, and DE13 of the plurality of cavities HX1, HX2, and HX3 may be equal to or different from one another.

As described below, a locally large electric field may be distributed to a desired location by a desired amount using at least one of the number of the cavities HX1, HX2, and HX3, the separation distances SD1 and SD2, the widths WI1, WI2, WI3, WJ1, WJ2 and WJ3, and the depths DE11, DE12 and DE13 (As shown in FIG. 7).

FIG. 4 is a plan view of a semiconductor device 100B according to another embodiment, and FIG. 5 is a cross-sectional view taken along line II-IF shown in FIG. 4.

The semiconductor device 100B shown in FIG. 4 may have a cross-sectional shape different from that shown in FIG. 5, and the semiconductor device 100B shown in FIG. 5 may have a planar shape different from that shown in FIG. 4.

To help understanding, invisible layers disposed below a first electrode ED1 and a second electrode ED2 in FIG. 4 are indicated by dotted lines.

Referring to FIGS. 4 and 5, the semiconductor device 100B according to another embodiment may include a substrate 110, a buffer layer 120, a first semiconductor layer 130, a second semiconductor layer 140, a third semiconductor layer 150, the first and second electrodes ED1 and ED2, and a first insulating layer 192.

The semiconductor device 100B shown in FIGS. 4 and 5 is the same as the semiconductor device 100A shown in FIGS. 1 and 2 except that the first and second electrodes ED1 and ED2 have different shapes and the second-first and second-second insulating layers 194 and 196 are not included so that the same reference numerals are used, a redundant description is omitted, and only a difference will be described.

FIG. 6 is a partially exploded cross-sectional view of the semiconductor device 100B shown in FIGS. 4 and 5 according to another embodiment.

A reference numeral 210 in FIG. 6 may correspond to the first or second semiconductor layer 130 or 140, and a reference numeral 220 may correspond to the first or second electrode ED1 or ED2. That is, the reference numerals 210 and 220 may respectively correspond to the first semiconductor layer 130 and the first electrode ED1 or to the second semiconductor layer 140 and the second electrode ED2.

In the semiconductor device 100B according to another embodiment shown in FIGS. 4 and 5, a first end part of the first electrode ED1 may include at least one first protrusion PR1 protruding toward the first semiconductor layer 130 or 210 as an electric field distribution part. The first protrusion PR1 may be a protruding portion in a thickness direction (e.g., a −z axis direction) of the first semiconductor layer 130 or 210 and may be inserted into the first semiconductor layer 130 or 210. To this end, the first semiconductor layer 130 or 210 may include a first trench T1 for accommodating the first protrusion PR1. As described above, in the semiconductor device 100B shown in FIGS. 4 and 5, the first protrusion PR1 and the first trench T1 may be included in the electric field distribution part.

As the first end part of the first electrode ED1 has the electric field distribution part, a second end part of the second electrode ED2 may also have an electric field distribution part as follows.

The second end part of the second electrode ED2 may include at least one second protrusion PR2 protruding toward the second semiconductor layer 140 or 220 as the electric field distribution part. The second protrusion PR2 may be a protruding portion in a thickness direction (e.g., the −z axis direction) of the second semiconductor layer 140 or 220 and may be inserted into the second semiconductor layer 140 or 220. To this end, the second semiconductor layer 140 or 220 may include a second trench T2 for accommodating the second protrusion PR2. As described above, in the semiconductor device 100B shown in FIGS. 4 and 5, the second protrusion PR2 and the second trench T2 may be included in the electric field distribution part.

Referring to the plan view shown in FIG. 4, the number of each of first and second protrusions PR1 and PR2 is illustrated as being one, but the present embodiment is not limited thereto. That is, according to another embodiment, the number of first and second protrusions PR1 and PR2 may be two or more.

For example, referring to FIG. 6, at least one first protrusion PR1 may include three first protrusions PRX1, PRX2, and PRX3. In this case, three first trenches TX1, TX2 and TX3 may be formed at the first semiconductor layer 130 or 210 to accommodate the three first protrusions PRX1, PRX2, and PRX3. Likewise, referring to FIG. 6, at least one second protrusion PR2 may include three second protrusions PRX1, PRX2, and PRX3. In this case, three second trenches TX1, TX2 and TX3 may be formed at the second semiconductor layer 140 or 220 to accommodate the three second protrusions PRX1, PRX2, and PRX3.

For example, the number of each of the first and second protrusions PR1 and PR2 may be in the range of 1 to 5, but the present embodiment is not limited thereto.

Further, a fifth distance D5 in a horizontal direction (e.g., a −y-axis direction) from the at least one first protrusion PR1 protruding toward the first semiconductor layer 130 or 210 to an edge ED1-2 of the first end part of the first electrode ED1 may be shorter than a sixth distance D6 in the horizontal direction (e.g., the −y-axis direction) from the at least one first protrusion PR1 to a center C1 of the first electrode ED 1. The fact that the fifth distance D5 is shorter than the sixth distance D6 means that the at least one first protrusion PR1 is disposed at the first end part of the first electrode ED1. Here, the fifth distance D5 may be measured from one surface PR11 of the first protrusion PR1, and the sixth distance D6 may be measured from the other surface PR12 of the first protrusion PR1. Here, the one surface PR11 of the first protrusion PR1 may be an outer surface disposed adjacent to the first insulating layer 192, and the other surface of the first protrusion PR1 may be an outer surface disposed in a direction opposite the one surface PR11. However, the present embodiment is not limited thereto. That is, according to another embodiment, the fifth distance D5 may be measured from a center of the first protrusion PR1 or the outer surface PR12 thereof, and the sixth distance D6 may be measured from the center of the first protrusion PR1 or the one surface PR11 thereof. In this case, the fifth distance D5 may be in the range of 1 μm to 5 μm, but the present embodiment is not limited thereto.

Referring to FIG. 5, a first end part TE1 of the first electrode ED1 may be defined as a region from the edge ED1-2 in contact with the first semiconductor layer 130 among edges of the first electrode ED1 to the other surface PR12 of the first protrusion PR1. Alternatively, as shown in FIG. 6, when a plurality of the first protrusion PR1 are provided, the first end part TE1 of the first electrode ED1 may be defined as a region from the edge ED1-2 in contact with the first semiconductor layer 130 among the edges of the first electrode ED1 to the outer side PR12 of the outermost first protrusion PRX3.

Further, a seventh distance D7 from the at least one second protrusion PR2 protruding toward the second semiconductor layer 140 or 220 to an edge ED2-2 of the second end part of the second electrode ED2 may be shorter than an eighth distance D8 from the at least one second protrusion PR2 to a center C2 of the second electrode ED2. The fact that the seventh distance D7 is shorter than the eighth distance D8 means that the at least one second protrusion PR2 is disposed at the second end part of the second electrode ED2. Here, the eighth distance D8 may be measured from one surface PR21 of the second protrusion PR2, and the seventh distance D7 may be measured from the other surface PR22 of the second protrusion PR2. Here, the one surface PR21 of the second protrusion PR2 may be an outer surface disposed adjacent to the center C2 of the second electrode ED2, and the other surface of the first protrusion PR1 may be an outer surface disposed in a direction opposite the one surface PR21 of the second protrusion PR2. However, the present embodiment is not limited thereto. That is, according to another embodiment, the seventh distance D7 may be measured from a center of the second protrusion PR2 or the inner side PR21 thereof, and the eighth distance D8 may be measured from the center of the second protrusion PR2 or the outer side PR22 thereof.

In this case, the seventh distance D7 may be in the range of 1 μm to 5 μm, but the present embodiment is not limited thereto.

Referring to FIG. 5, a second end part TE2 of the second electrode ED2 may be defined as a region from the edge ED2-2 in contact with the second semiconductor layer 140 among edges of the second electrode ED2 to the inner side PR21 of the second protrusion PR2. Alternatively, when the cross section shown in FIG. 6 corresponds to another embodiment of a second protrusion PR2 disposed at a left side of two second protrusions PR2 shown in FIG. 5, the second end part TE2 of the second electrode ED2 may be defined as a region from the edge ED2-2 in contact with the second semiconductor layer 140 among the edges of the second electrode ED2 to the inner side PR12 of the outermost second protrusion PRX3.

In the semiconductor device 100B shown in FIGS. 4 and 5, the electric field distribution part has been illustrated as being formed at both of the first end part TE1 of the first electrode ED1 and the second end part TE2 of the second electrode ED2, but the present embodiment is not limited thereto. Alternatively, according to another embodiment, the electric field distribution part may be formed at only the first end part TE1 or only the second end part TE2.

As shown in FIG. 6, when each of the first and second protrusions PR1 and PR2 is configured with the plurality of protrusions PRX1, PRX2, and PRX3, separation distances SD3 and SD4 by which the plurality of protrusions PRX1, PRX2, and PRX3 are separated may be equal to or different from each other.

Further, widths WJ1, WJ2, and WJ3 of the plurality of protrusions PRX1, PRX2, and PRX3 may be equal to or different from one another.

Furthermore, heights h1, h2, and h3 of the plurality of protrusions PRX1, PRX2, and PRX3 may be equal to or different from one another.

Moreover, depths DE21, DE22, and DE23 of the plurality of trenches TX1, TX2, and TX3 may be equal to or different from one another.

As described below, a locally large electric field may be distributed to a desired location by a desired amount using at least one of the number of the protrusions PRX1, PRX2, and PRX3, the separation distances SD3 and SD4, the widths WJ1, WJ2, and WJ3, the heights h1, h2, and h3, and the depths DE21, DE22, and DE23.

Further, the first and second trenches T1 and T2 may be formed by either dry etching or wet etching. However, due to the nature of the materials forming the first and second semiconductor layers 130 and 140, wet etching is difficult to be applied to the first and second semiconductor layers 130 and 140 and thus the first and second semiconductor layers 130 and 140 may be dry-etched. However, dry etching may cause material damage to the first and second trenches T1 and T2. Therefore, in consideration of the above description, the semiconductor device 100B may be manufactured.

FIG. 7 is a plan view of a semiconductor device 100C according to still another embodiment, and FIG. 8 is a cross-sectional view taken along line shown in FIG. 7.

The semiconductor device 100C shown in FIG. 7 may have a cross-sectional shape different from that shown in FIG. 8, and the semiconductor device 100C shown in FIG. 8 may have a planar shape different from that shown in FIG. 7.

To help understanding, invisible layers disposed below a first electrode ED1 and a second electrode ED2 in FIG. 7 are indicated by dotted lines.

Referring to FIGS. 7 and 8, the semiconductor device 100C according to still another embodiment may include a substrate 110, a buffer layer 120, a first semiconductor layer 130, a second semiconductor layer 140, a third semiconductor layer 150, the first and second electrodes ED1 and ED2, and a first insulating layer 192.

The semiconductor device 100C shown in FIGS. 7 and 8 is the same as the semiconductor device 100B shown in FIGS. 4 and 5 except that the first and second electrodes ED1 and ED2 have different shapes so that the same reference numerals are used, a redundant description is omitted, and only a difference will be described.

Unlike that the first and second electrodes ED1 and ED2 shown in FIGS. 1 and 2 respectively have first and second cavities H1 and H2, and the first and second electrodes ED1 and ED2 shown in FIGS. 4 and 5 respectively have first and second protrusions PR1 and PR2, the first and second electrodes ED1 and ED2 shown in FIGS. 7 and 8 do not have the cavities H1 and H2 or the protrusions PR1 and PR2.

Instead, in the semiconductor device 100C shown in FIGS. 7 and 8, a second end part TE2 of the second electrode ED2 includes an edge ED2-3, which is spaced a ninth distance D9 from a first interface ED1-3 between the first electrode ED1 and the first insulating layer 192, as an electric field distribution part. Thus, the electric field distribution part of the second end part TE2 of the second electrode ED2 may overlap the first insulating layer 192 and the first semiconductor layer 130 in a vertical direction (e.g., the z-axis direction). In this case, the ninth distance D9 may be in the range of 1 μm to 5 μm, but the present embodiment is not limited thereto.

Further, the first end part of the first electrode ED1 and the second end part of the second electrode ED2 may be disposed to face each other on the first semiconductor layer 130. A space between the first end part of the first electrode ED1 and the second end part of the second electrode ED2 is defined as a first opening OP1. To this end, the second electrode ED2 may be disposed to extend from an upper portion of the second semiconductor layer 140 to an upper portion of the first semiconductor layer 130 via the first insulating layer 192 formed in the lateral part of the light-receiving structure.

Since a high electric field at the first interface ED1-3 exposed to the first opening OP1 is distributed to the edge ED2-3 of the second end part TE2, a portion of the second electrode ED2 overlapping the first insulating layer 192 and the first semiconductor layer 130 in the vertical direction may correspond to the electric field distribution part.

FIG. 9 is a plan view of a semiconductor device 100D according to yet another embodiment, and FIG. 10 is a cross-sectional view taken along line IV-IV' shown in FIG. 9.

The semiconductor device 100D shown in FIG. 9 may have a cross-sectional shape different from that shown in FIG. 10, and the semiconductor device 100D shown in FIG. 10 may have a planar shape different from that shown in FIG. 9.

To help understanding, invisible layers disposed below a first electrode ED1 and a second electrode ED2 in FIG. 9 are indicated by dotted lines.

Referring to FIGS. 9 and 10, the semiconductor device 100D according to yet another embodiment may include a substrate 110, a buffer layer 120, a first semiconductor layer 130, a second semiconductor layer 140, a third semiconductor layer 150, the first and second electrodes ED1 and ED2, and a first insulating layer 192.

The semiconductor device 100D shown in FIGS. 9 and 10 is the same as the semiconductor device 100C shown in FIGS. 7 and 8 except that the first and second electrodes ED1 and ED2 have different shapes so that the same reference numerals are used, a redundant description is omitted, and only a difference will be described.

That is, the substrate 110, the buffer layer 120, the first semiconductor layer 130, the second semiconductor layer 140, the third semiconductor layer 150, and the first insulating layer 192 shown in FIGS. 9 and 10 correspond to the substrate 110, the buffer layer 120, the first semiconductor layer 130, the second semiconductor layer 140, the third semiconductor layer 150, and the first insulating layer 192 shown in FIGS. 7 and 8, respectively, so that a redundant description will be omitted.

In the semiconductor device 100D shown in FIGS. 9 and 10, a first end part TE1 of the first electrode ED1 may include an edge ED1-4, which is spaced a tenth distance D10 from a second interface ED2-4 between the second electrode ED2 and the first insulating layer 192, as an electric field distribution part.

Thus, the electric field distribution part of the first end part TE1 of the first electrode ED1 may overlap the first insulating layer 192 and the first to third semiconductor layers 130, 140, and 150 in the vertical direction (e.g., the z-axis direction). For example, the tenth distance D10 may be in the range of 1 μm to 5 μm, but the present embodiment is not limited thereto.

Further, the first end part TE1 of the first electrode ED1 and the second end part of the second electrode ED2 may be disposed to face each other on the second semiconductor layer 140. A space between the first end part TE1 of the first electrode ED1 and the second end part of the second electrode ED2 is defined as a second opening OP2. To this end, the first electrode ED1 may be disposed to extend from an upper portion of the first semiconductor layer 130 to an upper portion of the second semiconductor layer 140 via the first insulating layer 192 formed in the lateral part of the light-receiving structure.

Since a high electric field at the second interface ED2-4 exposed to the second opening OP2 is distributed to the edge ED1-4 of the first end part TE1, a portion of the first electrode ED1 overlapping the first insulating layer 192 and the first to third semiconductor layers 130, 140, and 150 in the vertical direction may correspond to the electric field distribution part.

It can be seen that in the semiconductor devices 100A and 100B shown in FIGS. 1 to 6, when each of the first and second electrodes ED1 and ED2 separately includes an ohmic layer and a metal layer, at least one among the first ohmic layers 160A and 160B or the second ohmic layers 170A and 170B may include the electric field distribution part, whereas in the semiconductor devices 100C and 100D shown in FIGS. 7 to 10, metal layers 180C and 180D may have the electric field distribution part.

The semiconductor devices 100A, 100B, 100C, and 100D according to the above-described embodiments may be formed in a back-side type device in which light is incident toward the substrate 110 or in a front-side type device in which the light is incident toward the first and second electrodes ED1 and ED2, but the embodiments are not limited to a direction into which the light is incident.

Further, unlike a light-emitting device which operates with a forward biased voltage, when the semiconductor devices 100A, 100B, 100C, and 100D according to the above-described embodiments are light-receiving devices, the semiconductor devices 100A, 100B, 100C, and 100D may operate with a reverse biased voltage or in a zero bias state. That is, when the reverse biased voltage is applied (or in the zero bias state), light absorbed in the depletion region of each of the semiconductor devices 100A, 100B, 100C, and 100D is converted into electric energy such that the light may be detected.

Hereinafter, the semiconductor devices 100A, 100B, 100C, and 100D having the above-described configurations according to the embodiments and a semiconductor device according to Comparative Example will be described below with reference to the accompanying drawings.

FIG. 11 is a plan view of a semiconductor device according to Comparative Example, and FIG. 12 is a cross-sectional view of the semiconductor device taken along line V-V' shown in FIG. 11.

The semiconductor device according to Comparative Example shown in FIGS. 11 and 12 may include a substrate 10, a buffer layer 20, a first semiconductor layer 30, a second semiconductor layer 40, a third semiconductor layer 50, first and second electrodes ED1 and ED2, and a first insulating layer 92.

Unlike that the first and second electrodes ED1 and ED2 of the semiconductor device 100D according to the embodiment shown in FIGS. 9 and 10 include a first metal layer 182D and a second metal layer 184D, the first and second electrodes ED1 and ED2 of the semiconductor device according to Comparative Example shown in FIGS. 11 and 12 do not include any metal layer. That is, in the semiconductor device according to Comparative Example shown in FIGS. 11 and 12, each of the first and second electrodes ED1 and ED2 include only an ohmic layer. Except for the above description, the semiconductor device according to Comparative Example shown in FIGS. 11 and 12 is the same as the semiconductor device 100D according to the embodiment shown in FIGS. 9 and 10 so that a redundant description will be omitted. That is, the substrate 10, the buffer layer 20, the first semiconductor layer 30, the second semiconductor layer 40, the third semiconductor layer 50, the first and second electrodes ED1 and ED2, and the first insulating layer 92 shown in FIGS. 11 and 12 correspond to the substrate 110, the buffer layer 120, the first semiconductor layer 130, the second semiconductor layer 140, the third semiconductor layer 150, first and second ohmic layers 160D and 170D, and the first insulating layer 192 shown in FIGS. 9 and 10, respectively. Further, second-first and second-second semiconductor layers 42 and 44 may respectively correspond to the second-first and second-second semiconductor layers 142 and 144.

FIGS. 13A and 13B are photographs of an actual light-emitting device according to Comparative Example shown in FIG. 11.

Referring to FIG. 12, it can be seen that electric fields E1 and E2 are very high at positions y1 and y4 at which a portion P1 of an edge of the first ohmic layer ED1 is located and at positions y2 and y3 at which a portion P2 of an edge of the second ohmic layer ED2 is located. As described above, since it is difficult to form the first insulating layer 92 with a sufficient thickness due to degradation of film quality of the first insulating layer 92 in a high electric field situation, as shown in FIG. 13A or 13B, the first insulating layer 92 such as $SiO_2$ may be damaged at edges A and B of the second ohmic layer ED2. As described above, such a phenomenon in which the device is damaged at the edges A and B may be caused even when a level of an applied voltage is low.

On the other hand, in the semiconductor device 100A shown in FIGS. 1 and 2, at least one first or second cavity H1 or H2 and at least one second-first or second-second insulating layer 194 and 196 are formed as the electric field distribution part on at least one end part of the first end part and the second end part such that as shown in FIG. 2, the electric fields E1 and E2 at the positions y1, y2, y3 and y4 shown in FIG. 12 may be distributed to the one surfaces H11 and H21 and the other surfaces H12 and H22 of the first and second cavities 111 and H2. As described above, when the electric fields E1 and E2 are distributed, electric fields at the corresponding positions y1, y2, y3, and y4 may be reduced to an lower electric field E3. In this case, in the semiconductor device 100A according to the embodiment shown in FIGS. 1 and 2, when more cavities HX1, HX2, and HX3 are formed on at least one of the first or second end part of the first or second electrode ED1 or ED2 as shown in FIG. 3, an electric field distribution effect may be further enhanced.

Further, in the semiconductor device 100B shown in FIGS. 4 and 5, at least one protrusion PR1 or PR2 is formed on at least one end part of the first end part and the second end part as the electric field distribution part such that as shown in FIG. 5, the electric fields E1 and E2 at the positions y1, y2, y3 and y4 shown in FIG. 12 may be distributed to the one surfaces PR11 and PR21 and the other surfaces PR12 and PR22 of the first and second protrusions PR1 and PR2. As described above, when the electric fields E1 and E2 are distributed, electric fields at the corresponding positions y1, y2, y3, and y4 may be reduced to an lower electric field E4. In this case, in the semiconductor device 100B according to the embodiment shown in FIGS. 4 and 5, when more protrusions PRX1, PRX2, and PRX3 are formed on at least one of the first or second end part of the first or second electrode ED1 or ED2 as shown in FIG. 6, an electric field distribution effect may be further enhanced.

Further, in the semiconductor device 100C shown in FIGS. 7 and 8, the edge ED2-3 of the second end part TE2 of the second electrode ED2 serves as the electric field distribution part on the first semiconductor layer 130 and the first insulating layer 192 such that as shown in FIG. 8, the electric fields E1 and E2 at the positions y1, y2, y3, and y4 shown in FIG. 12 may be distributed to the edge ED2-3 of the second electrode ED2. As described above, when the electric fields E1 and E2 are distributed, electric fields at the corresponding positions y1, y2, y3, and y4 may be reduced to an lower electric field E5.

Further, in the semiconductor device 100D shown in FIGS. 9 and 10, the edge ED1-4 of the first end part TE1 of the first electrode ED1 serves as the electric field distribution part on the first to third semiconductor layers 130, 140, and 150 and the first insulating layer 192 such that as shown in FIG. 10, the electric fields E1 and E2 at the positions y1, y2, y3, and y4 shown in FIG. 12 may be distributed to the edge ED1-4 of the first electrode ED1. As described above, when the electric fields E1 and E2 are distributed, electric fields at the corresponding positions y1, y2, y3, and y4 may be reduced to a lower electric field E6.

Further, in the semiconductor devices 100C and 100D shown in FIGS. 7 to 10, since the electric field at the positions y1, y2, y3, and y4 is relatively large, the first insulating layer 192 may have a breakdown voltage capable of withstanding such a large electric field.

Consequently, the electric fields E3, E4, E5, and E6 at the positions y1, y2, y3, and y4 of each of the semiconductor devices 100A, 100B, 100C, and 100D according to the embodiments are significantly lowered than the electric fields E1 and E2 in FIG. 12. Therefore, the damage to the device as shown in FIG. 13A or 13B can be prevented in advance.

As described above, the semiconductor devices 100A to 100D according to the embodiments can distribute and lower a high electric field by providing the electric field distribution part on at least one of the first end part of the first electrode ED1 or the second end part of the second electrode ED2.

While the present invention has been mainly described with reference to the exemplary embodiments, it should be understood that the present invention is not limited to the disclosed exemplary embodiments, and various modifications and applications can be devised by those skilled in the art to which the present invention pertains without departing from the gist of the present invention. For example, each component specifically shown in the exemplary embodiments can be modified and implemented. It should be construed that differences related to these modifications and applications will fall within the scope of the present invention defined by the appended claims.

The invention claimed is:

1. A semiconductor device comprising:
   a substrate;
   a first semiconductor layer and a second semiconductor layer which are disposed on the substrate and have different conductivity types;
   a third semiconductor layer disposed between the first semiconductor layer and the second semiconductor layer;
   a first electrode disposed on the first semiconductor layer and electrically connected to the first semiconductor layer;
   a second electrode disposed on the second semiconductor layer and electrically connected to the second semiconductor layer; and
   a first insulating layer disposed on the first, second, and third semiconductor layers exposed between the first electrode and the second electrode, wherein at least one of a first end part among both end parts of the first electrode, which is close to the second electrode, and a second end part among both end parts of the second electrode has an electric field distribution part, wherein the electric field distribution part included in the second end part has an edge spaced a ninth distance from a first interface between the first electrode and the first insulating layer and overlaps the first insulating layer and the first semiconductor layer in a vertical direction, and wherein the electric field distribution part included in the first end part has an edge spaced a tenth distance from a second interface between the first insulating layer and the second electrode and overlaps the first insulating layer and the first to third semiconductor layers in the vertical direction.

2. The semiconductor device of claim 1, further comprising a second insulating layer disposed within at least one cavity, wherein the electric field distribution part includes the at least one cavity in contact with the first or second semiconductor layer.

3. The semiconductor device of claim 2, wherein:
a first distance from the at least one cavity in contact with the first semiconductor layer to an edge of the first end part is shorter than a second distance from the at least one cavity in contact with the first semiconductor layer to a center of the first electrode; and
a third distance from the at least one cavity in contact with the second semiconductor layer to an edge of the second end part is shorter than a fourth distance from the at least one cavity in contact with the second semiconductor layer to a center of the second electrode.

4. The semiconductor device of claim 2, wherein:
the at least one cavity includes a plurality of cavities; and
one or more among separation distances, by which the plurality of cavities are spaced apart from one another, and widths or depths of the plurality of cavities are different from each other.

5. The semiconductor device of claim 1, wherein:
the electric field distribution part includes at least one protrusion protruding toward the first or second semiconductor layer;
a fifth distance from the at least one protrusion protruding toward the first semiconductor layer to an edge of the first end part is shorter than a sixth distance from the at least one protrusion protruding toward the first semiconductor layer to a center of the first electrode; and
a seventh distance from the at least one protrusion protruding toward the second semiconductor layer to an edge of the second end part is shorter than an eighth distance from the at least one protrusion protruding toward the second semiconductor layer to a center of the second electrode.

6. The semiconductor device of claim 5, wherein:
the at least one protrusion includes a plurality of protrusions; and
one or more among separation distances, by which the plurality of protrusions are spaced apart from one another, and widths or heights of the plurality of protrusions are different from each other.

7. The semiconductor device of claim 1, wherein:
the first end part and the second end part are disposed to face each other on the first semiconductor layer; and
the first end part and the second end part are disposed to face each other on the second semiconductor layer.

8. The semiconductor device of claim 1, wherein:
the first electrode includes:
a first ohmic layer disposed on the first semiconductor layer; and
a first metal layer disposed on the first ohmic layer, wherein the first ohmic layer and the first metal layer are integrated; and
the second electrode includes:
a second ohmic layer disposed on the second semiconductor layer; and
a second metal layer disposed on the second ohmic layer, wherein the second ohmic layer and the second metal layer are integrated.

9. The semiconductor device of claim 8, wherein the first or second ohmic layers includes the electric field distribution part.

10. The semiconductor device of claim 1, wherein the first insulating layer includes at least one among a first insulating part disposed on the first semiconductor layer, a second insulating part disposed on the second semiconductor layer, and a third insulating part disposed at lateral parts of the first to third semiconductor layers between the first and second insulating parts.

11. The semiconductor device of claim 10, wherein the first insulating part is spaced apart from the first electrode.

12. The semiconductor device of claim 10, wherein the second insulating part is spaced apart from the second electrode.

13. The semiconductor device of claim 1, wherein the first end part is disposed adjacent the inner circumference.

14. The semiconductor device of claim 1, wherein the second electrode is disposed to extend from an upper portion of the second semiconductor layer to an upper portion of the first semiconductor layer.

15. The semiconductor device of claim 14, wherein the first insulating layer is exposed through a first opening, and
wherein the first opening is disposed between the first end part of the first electrode and the second end part of the second electrode.

16. The semiconductor device of claim 14, wherein the electric field distribution part of the second end part overlaps the first insulating layer and the first semiconductor layer in the vertical direction.

17. The semiconductor device of claim 1, wherein the first electrode is disposed to extend from an upper portion of the first semiconductor layer to an upper portion of the second semiconductor layer.

18. The semiconductor device of claim 17, wherein the first insulating layer is exposed through a second opening, and
wherein the second opening is disposed between the first end part of the first electrode and the second end part of the second electrode.

19. The semiconductor device of claim 17, wherein the electric field distribution part of the first end part overlaps the first insulating layer and the second semiconductor layer in the vertical direction.

* * * * *